(12) United States Patent
Zhang et al.

(10) Patent No.: US 11,191,155 B1
(45) Date of Patent: Nov. 30, 2021

(54) TAMPER-RESPONDENT ASSEMBLY WITH STRUCTURAL MATERIAL WITHIN SEALED INNER COMPARTMENT

(71) Applicant: INTERNATIONAL BUSINESS MACHINES CORPORATION, Armonk, NY (US)

(72) Inventors: Hongqing Zhang, Hopewell Junction, NY (US); Jay A. Bunt, Esopus, NY (US); Shidong Li, Hopewell Junction, NY (US); Zhigang Song, Hopewell Junction, NY (US); Junjun Li, Hopewell Junction, NY (US); Guoda Lian, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/117,277

(22) Filed: Dec. 10, 2020

(51) Int. Cl.
  *H05K 7/00* (2006.01)
  *H05K 1/02* (2006.01)
  *H05K 3/30* (2006.01)

(52) U.S. Cl.
  CPC ............ *H05K 1/0275* (2013.01); *H05K 3/30* (2013.01); *H05K 2201/10151* (2013.01)

(58) Field of Classification Search
  CPC .................. H05K 1/0275; H05K 3/30; H05K 2201/10151
  (Continued)

(56) References Cited

U.S. PATENT DOCUMENTS

| 4,853,690 A | 8/1989 | Mayer et al. |
| 6,080,219 A * | 6/2000 | Jha ............... B22F 3/114 |
| | | 55/486 |

(Continued)

FOREIGN PATENT DOCUMENTS

| CN | 208278680 U | 12/2018 |
| CN | 111017380 A | 4/2020 |

(Continued)

OTHER PUBLICATIONS

Zhang et al., "Tamper-Respondent Assemblies with Porous Heat Transfer Element(s)", U.S. Appl. No. 17/117,267, filed Dec. 10, 2020 (44 pages).

(Continued)

*Primary Examiner* — Andargie M Aychillhum
(74) *Attorney, Agent, or Firm* — Tihon Poltavets, Esq.; Kevin P. Radigan, Esq.; Heslin Rothenberg Farley & Mesiti P.C.

(57) ABSTRACT

Tamper-respondent assemblies are provided which include a circuit board, an enclosure assembly mounted to the circuit board, and a pressure sensor. The circuit board includes an electronic component, and the enclosure assembly is coupled to the circuit board to enclose the electronic component within a secure volume. The enclosure assembly includes an enclosure with a sealed inner compartment, and a structural material within the sealed inner compartment of the enclosure. The structural material within the enclosure inhibits deflection of the enclosure due to a pressure differential between pressure of the sealed inner compartment and pressure around, at least in part, the enclosure. The pressure sensor senses pressure within the sealed inner compartment of the enclosure to facilitate identifying a pressure change indicative of a tamper event.

20 Claims, 10 Drawing Sheets

(58) Field of Classification Search
USPC .......................................................... 361/760
See application file for complete search history.

(56) References Cited

U.S. PATENT DOCUMENTS

| | | | |
|---|---|---|---|
| 6,396,400 B1 | 5/2002 | Epstein et al. | |
| 7,659,816 B2 | 2/2010 | Wandel | |
| 7,787,256 B2 * | 8/2010 | Chan | G08B 13/128 |
| | | | 361/760 |
| 7,954,697 B2 | 6/2011 | Deng | |
| 8,325,486 B2 * | 12/2012 | Arshad | G06F 21/86 |
| | | | 361/737 |
| 9,071,446 B2 | 6/2015 | Kreft | |
| 9,904,811 B2 | 2/2018 | Campbell et al. | |
| 2010/0031368 A1 | 2/2010 | Park et al. | |
| 2017/0171999 A1 * | 6/2017 | Fisher | H05K 5/0208 |
| 2018/0090009 A1 | 3/2018 | Horst et al. | |
| 2018/0323130 A1 | 11/2018 | Liu et al. | |
| 2019/0313526 A1 * | 10/2019 | Busby | H05K 1/0203 |
| 2020/0098666 A1 | 3/2020 | Wan et al. | |

FOREIGN PATENT DOCUMENTS

| | | |
|---|---|---|
| CN | 111537568 A | 8/2020 |
| EP | 3 300 047 A1 | 3/2018 |
| EP | 2 018 533 B1 | 10/2018 |
| EP | 3 224 825 B1 | 12/2018 |
| EP | 3 444 736 A1 | 2/2019 |
| JP | 5676100 B2 | 2/2015 |
| KR | 10-0626619 B1 | 9/2006 |
| KR | 10-0879582 B1 | 1/2009 |
| KR | 10-20120013763 A | 2/2012 |
| KR | 10-20130110389 A | 10/2013 |
| WO | WO 2016/083917 A1 | 6/2016 |

OTHER PUBLICATIONS

Zhang et al., "List of IBM Patents and/or Patent Applications Treated as Related", U.S. Appl. No. 17/117,277, filed Dec. 10, 2020, dated Dec. 10, 2020 (2 pages).

* cited by examiner

TAMPER-RESPONDENT ASSEMBLY WITH STRUCTURAL MATERIAL WITHIN SEALED INNER COMPARTMENT

BACKGROUND

Many activities require secure electronic communications. To facilitate secure electronic communications, an encryption/decryption system can be implemented on an electronic assembly or circuit board assembly that is included in equipment connected to a communications network. Such an electronic assembly is an enticing target for malefactors since it may contain codes or keys to decrypt intercepted messages, or to encode fraudulent messages. To prevent this, the electronic assembly can be mounted in an enclosure, which is then wrapped in a security sensor and encapsulated with polyurethane resin. The security sensor can be, in one or more embodiments, a web or sheet of insulating material with circuit elements, such as closely-spaced, conductive lines fabricated on it. The circuit elements are disrupted if the sensor is torn, and the tear can be sensed in order to generate an alarm signal. The alarm signal can be conveyed to a monitor circuit in order to reveal an attack on the integrity of the assembly, triggering an erasure of encryption/decryption keys stored within the electronic assembly.

SUMMARY

Provided herein, in one or more aspects, is a tamper-respondent assembly, which includes a circuit board, an enclosure assembly mounted to the circuit board, and a pressure sensor. The circuit board includes an electronic component, and the enclosure assembly is mounted to the circuit board to enclose the electronic component within a secure volume. The enclosure assembly includes an enclosure and a structural material. The enclosure includes a sealed inner compartment within the enclosure, and the structural material is within the sealed inner compartment of the enclosure. The structural material within the enclosure inhibits deflection of the enclosure due to a pressure differential between pressure of the sealed inner compartment and pressure around, at least in part, the enclosure. The pressure sensor senses pressure within the sealed inner compartment of the enclosure to facilitate identifying a pressure change indicative of a tamper event.

In another aspect, a tamper-respondent assembly is provided which includes a circuit board, multiple electronic components, a first enclosure assembly, a second enclosure assembly, and a pressure sensor. The circuit board includes a first side and a second side, with the first side and second side being opposite sides of the circuit board. The multiple electronic components include at least one first electronic component coupled to the first side of the circuit board, and at least one second electronic component coupled to the second side of the circuit board. The first enclosure assembly is mounted to the first side of the circuit board to enclose the at least one first electronic component coupled to the first side of the circuit board within a first chamber of a secure volume. The first enclosure assembly includes an enclosure and a structural material. The enclosure has a sealed inner compartment within the enclosure, and the structural material is within the sealed inner compartment of the enclosure. The structural material within the enclosure inhibits deflection of the enclosure due to a pressure differential between pressure of the sealed inner compartment and pressure around, at least in part, the enclosure. The second enclosure assembly is mounted to the second side of the circuit board to enclose the at least one second electronic compartment coupled to the second side of the circuit board within a second chamber of the secure volume. The pressure sensor senses pressure within the sealed inner compartment of the enclosure of the first enclosure assembly to facilitate identifying a pressure change indicative of a tamper event.

In a further aspect, a method of fabricating a tamper-respondent assembly is provided. The method includes providing a circuit board with an electronic component, and mounting an enclosure assembly to the circuit board to enclose the electronic component within a secure volume. The enclosure assembly includes an enclosure and a structural material. The enclosure includes a sealed inner compartment within the enclosure, and the structural material is within the sealed inner compartment of the enclosure. The structural material within the enclosure inhibits deflection of the enclosure due to a pressure differential between pressure of the sealed inner compartment and pressure around, at least in part, the enclosure. The method further includes providing a pressure sensor to sense pressure within the sealed inner compartment of the enclosure to facilitate identifying a pressure change indicative a tamper event.

Additional features and advantages are realized through the techniques described herein. Other embodiments and aspects of the invention are described in detail herein and are considered a part of the claimed aspects.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting example(s) illustrated in the accompanying drawings. Descriptions of well-known materials, fabrication tools, processing techniques, etc., are omitted so as not to unnecessarily obscure the invention in detail. It should be understood, however, that the detailed description and the specific example(s), while indicating aspects of the invention, are given by way of illustration only, and are not by way of limitation. Various substitutions, modifications, additions, and/or arrangements, within the spirit and/or scope of the underlying inventive concepts will be apparent to those skilled in the art for this disclosure. Note further that reference is made below to the drawings, which are not drawn to scale for ease of understanding, wherein the same reference numbers used throughout different figures designate the same or similar components. Also, note that numerous inventive aspects and features are disclosed herein, and unless inconsistent, each disclosed aspect or feature is combinable with any other disclosed aspect or feature as desired for a particular application, for instance, of a tamper-respondent assembly.

Figure 1A:
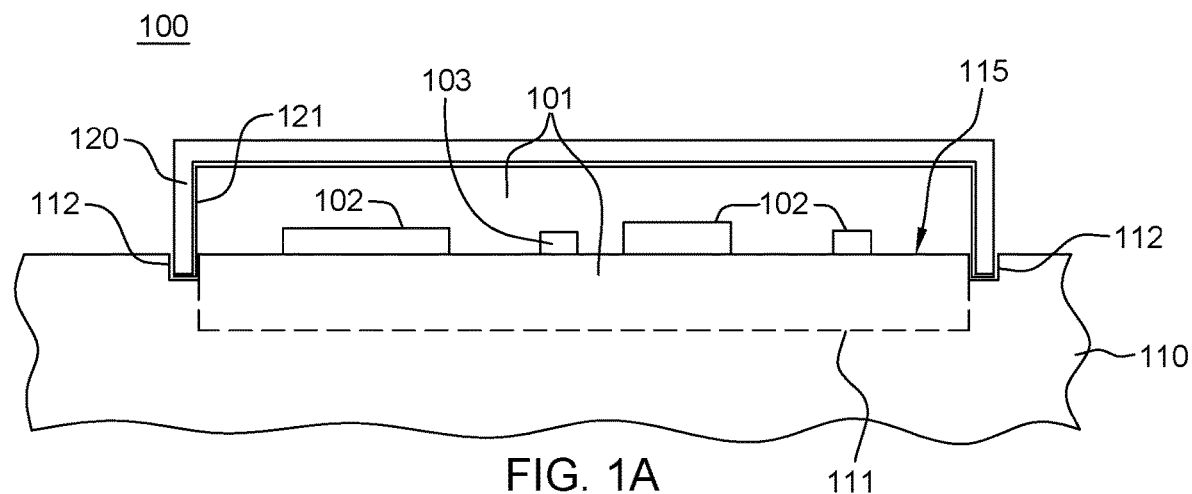
FIG. 1A is a cross-sectional elevational view of one embodiment of a tamper-proof electronic package, or tamper-respondent assembly, which includes (in part) an enclosure and a multilayer circuit board with an embedded tamper-detect circuit.
Figure 1B:
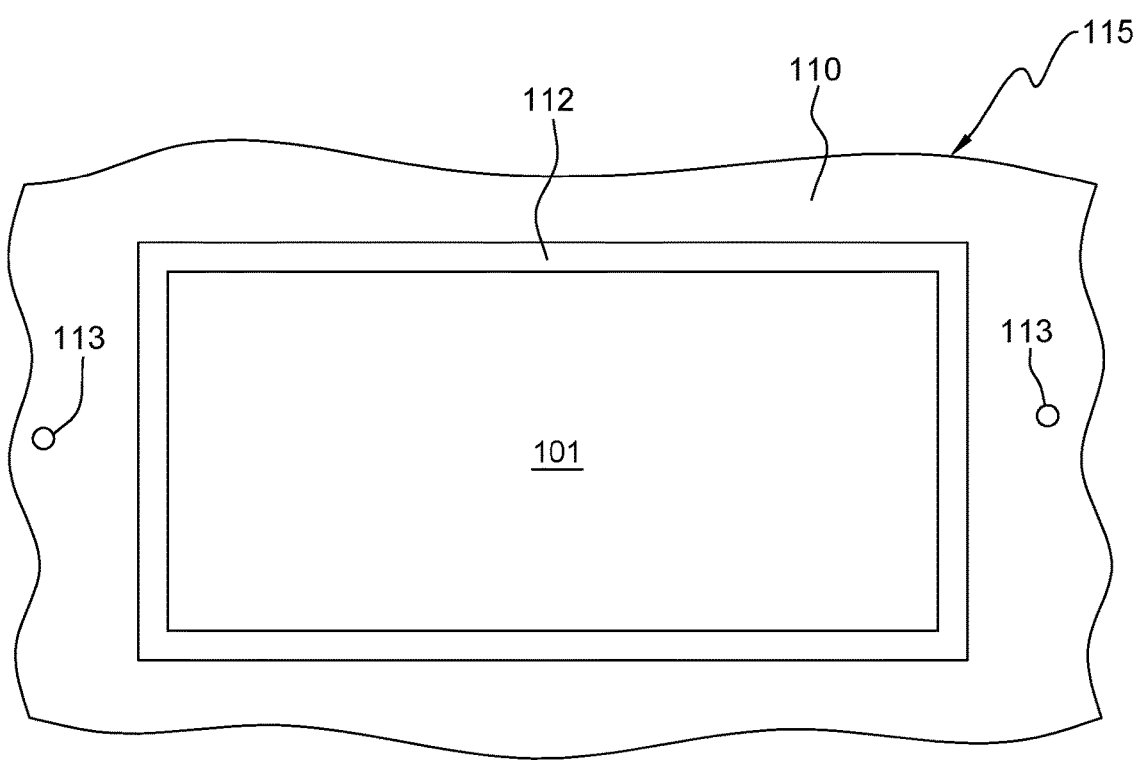
FIG. 1B is a top plan view of the multilayer circuit board of FIG. 1A.

FIGS. 1A & 1B depict one embodiment of a tamper-proof electronic package or tamper-respondent assembly 100 which includes one or more electronic components, such as a circuit 115 and/or electronic devices (or elements) 102 coupled to a multilayer circuit board 110.

Referring collectively to FIGS. 1A & 1B, circuit 115 resides on or is embedded within multilayer circuit board 110, which also has an embedded tamper-respondent sensor 111 that facilitates defining, in part, a secure volume 101 associated with multilayer circuit board 110 that (in one or more embodiments) extends into multilayer circuit board 110. In particular, in the embodiment of FIGS. 1A & 1B, secure volume 101 can exist partially within multilayer circuit board 110, and partially above multilayer circuit board 110. One or more electronic devices 102 are mounted to multilayer circuit board 110 within secure volume 101 and can include, for instance, one or more encryption modules and/or decryption modules, and/or associated components, to be protected within the tamper-proof electronic package. In one or more implementations, the one or more electronic components to be protected can include, for instance, components of a secure communications card of a computer system.

Tamper-proof electronic package 100 further includes an enclosure 120, such as a pedestal-type enclosure, mounted to multilayer circuit board 110 within, for instance, a continuous groove (or trench) 112 formed within an upper surface of multilayer circuit board 110, and secured to the multilayer circuit board 110 via, for instance, a structural adhesive disposed within continuous groove 112. In one or more embodiments, enclosure 120 can be made of a thermally conductive material and operate as a heat sink for facilitating cooling of the one or more electronic components 102 within the secure volume. A security mesh or tamper-respondent sensor 121 can be associated with enclosure 120, for example, wrapping around the inner surface of enclosure 120, to facilitate defining, in combination with tamper-respondent sensor 111 embedded within multilayer circuit board 110, secure volume 101. In one or more other implementations, enclosure 120 can be securely affixed to a surface of multilayer circuit board 110 (without a continuous groove) using, for instance, a bonding material such as an epoxy or other adhesive.

Briefly described, tamper-respondent sensor 121 can include, in one or more examples, one or more tamper-detection layers which include circuit lines or traces provided on one or both sides of a structural layer, which in one or more implementations, can be a flexible insulating layer or film. The circuit lines on one or both sides of the flexible layer can be of a line width and have a pitch or line-to-line spacing such that piercing of the layer at any point results in damage to one or more of the circuit lines or traces. In one or more implementations, the circuit lines can define one or more conductors which can be electrically connected in a network to an enclosure monitor or detector 103, which monitors, for instance, resistance on the lines. Detection of a change in resistance caused by cutting or damaging one or more of the lines, will cause information within the secure volume to be automatically erased. The conductive lines of the tamper-respondent sensor can be in any desired pattern, such as a sinusoidal pattern, to make it more difficult to breach the tamper-detection layer without detection.

For resistive monitoring, a variety of materials can be employed to form the circuit lines. For instance, the circuit lines can be formed of a metal or metal alloy, such as copper, or silver, or can be formed, for example, of an intrinsically-conductive polymer, carbon ink, or nickel phosphorous (NiP), or Omega-Ply®, offered by Omega Technologies, Inc., of Culver City, Calif. (USA), or Ticer™, offered by Ticer Technologies, Chandler, Ariz. (USA). The process employed to form the fine circuit lines or traces is dependent, in part, on the choice of materials used for the circuit lines. For instance, if copper circuit lines are fabricated, then additive processing, such as plating of copper traces, or subtractive processing, such as etching away unwanted copper between trace lines, can be employed.

As noted, in one or more implementations, the circuit lines of the tamper-respondent sensor(s) lining the inner surface(s) of enclosure 120, or even printed directly onto one or more layers formed over the inner surface of enclosure 120, can be connected to define one or more detect networks.

If a flexible layer is used over the inner surface of enclosure 120, then the flexible layer can be formed of a crystalline polymer material. For instance, the crystalline polymer could include polyvinylidene difluoride (PVDF), or Kapton, or other crystalline polymer material. Advantageously, a crystalline polymer can be made much thinner, while still maintaining structural integrity of the flexible substrate, which also allows for enhanced folding, and greater reliability of the sensor after folding.

As depicted in FIG. 1B, one or more external circuit connection vias 113 can be provided within multilayer circuit board 110 for electrically connecting to the one or more electronic components within secure volume 101. These one or more external circuit connection vias 113 can electrically connect to one or more external signal lines or planes (not shown) embedded within multilayer circuit board 110 and extending, for instance, into a secure base region of (or below) secure volume 101. Electrical connections to and from secure volume 101 can be provided by coupling to such external signal lines or planes within the multilayer circuit board 110.

As noted, secure volume 101 can be sized to house one or more electronic components to be protected, and can be constructed to extend into multilayer circuit board 110. In one or more implementations, multilayer circuit board 110 includes electrical interconnect within the secure volume 101 defined in the board, for instance, for electrically connecting one or more tamper-detection layers of the embedded tamper-respondent sensor 111 to associated monitor circuitry also disposed within secure volume 101, along with, for instance, one or more daughter cards, such as memory DIMMs, PCIe cards, processor cards, etc.

Note that the packaging embodiment depicted in FIGS. 1A & 1B is presented by way of example only. Other configurations of enclosure 120, or multilayer circuit board 110 can be employed, and/or other approaches to coupling enclosure 120 and multilayer circuit board 110 can be used. For instance, in one or more alternate implementations, enclosure 120 can be securely affixed to an upper surface of multilayer circuit board 110 (without a continuous groove) using, for instance, a structural bonding material such as an epoxy or other adhesive.

Figure 2:
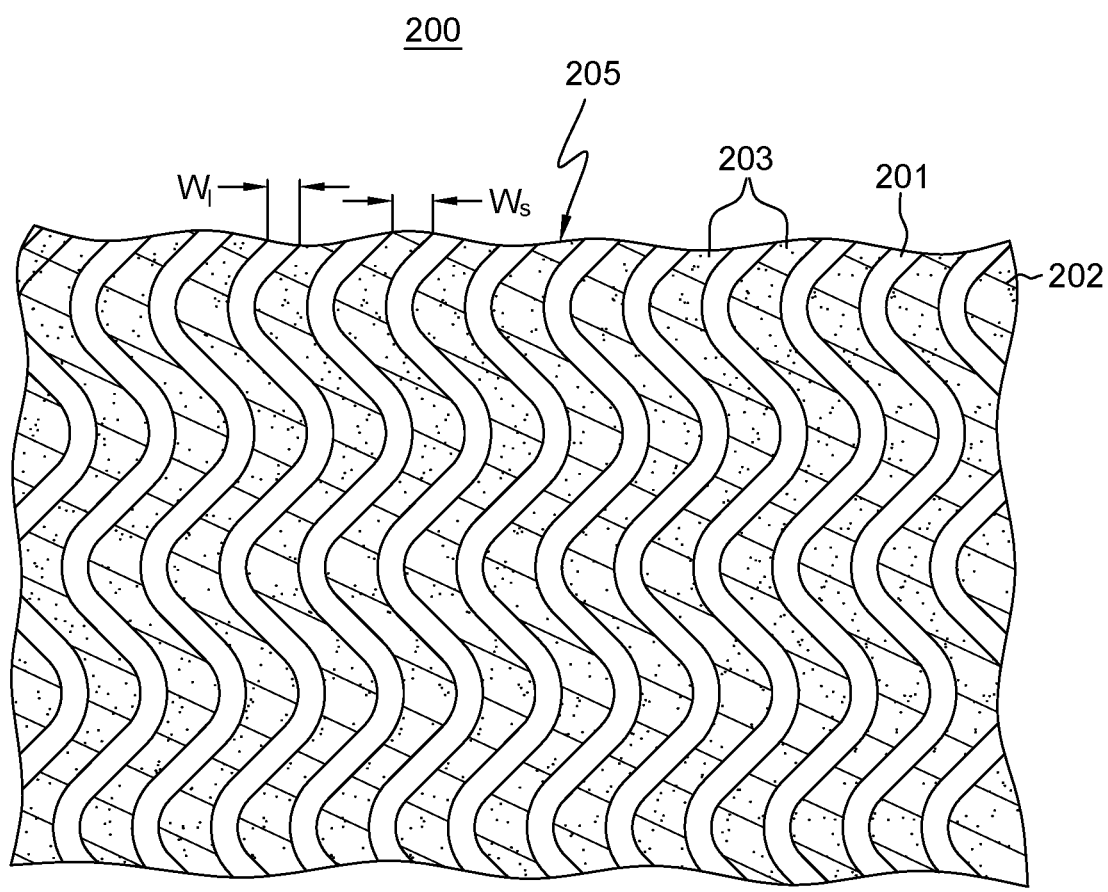
FIG. 2 depicts one embodiment of a tamper-respondent sensor with conductive lines forming, at least in part, at least one tamper-detect circuit.

FIG. 2 depicts a portion of one embodiment of a tamper-detection layer 205 (or laser and pierce-respondent layer) of a tamper-respondent sensor 200 or security sensor. In FIG. 2, tamper-detection layer 205 includes circuit lines or traces 201 provided on one or both opposite sides of a layer, such as a flexible layer 202, which in one or more embodiments, may be a flexible insulating layer or film.

FIG. 2 illustrates circuit lines 201 on, for instance, one side of flexible layer 202, with the traces on the opposite side of the film being, for instance, the same pattern, but (in one or more embodiments) offset to lie directly below spaces 203, between circuit lines 201. As described below, the circuit lines on one side of the flexible layer may be of a line width W and have a pitch or line-to-line spacing Ws such that piercing of the layer 205 at any point results in damage to at least one of the circuit lines traces 201. In one or more implementations, the circuit lines can be electrically connected in-series or parallel to define one or more conductors which can be electrically connected in a network to an enclosure monitor, which may, in one or more implementations, monitor the resistance of the lines. Detection of an increase, or other change, in resistance, caused by cutting or damaging one of the traces, will cause information within the encryption and/or decryption module to be erased. Providing conductive lines 201 in a pattern, such as a sinusoidal pattern, can advantageously make it more difficult to breach tamper-detection layer 205 without detection. Note, in this regard, that conductive lines 201 could be provided in any desired pattern. For instance, in an alternate implementation, conductive lines 201 could be provided as parallel, straight conductive lines, if desired, and the pattern or orientation of the pattern may vary between sides of a layer, and/or between layers.

As noted, as intrusion technology continues to evolve, anti-intrusion technology needs to continue to improve to stay ahead. In one or more implementations, the above-summarized tamper-respondent sensor 200 of FIG. 2 can cover or line an inner surface of an enclosure to provide a secure volume about at least one electronic component to be protected. Further, the tamper-respondent sensor, or more particularly, the tamper-detect circuit(s) of the sensor, could be embedded within a multilayer circuit board described below.

Note also that a variety of materials can advantageously be employed to form the circuit lines when implemented using resistance monitoring. For instance, the circuit lines can be formed of a conductive ink (such as a carbon-loaded conductive ink) printed onto one or both opposite sides of one or more of the flexible layers 202 in a stack of such layers. Alternatively, a metal or metal alloy could be used to form the circuit lines, such as copper, silver, intrinsically conductive polymers, carbon ink, or nickel-phosphorus (NiP), such as Omega-Ply®, offered by Omega Technologies, Inc. of Culver City, Calif. (USA), or nickel-chrome, such as Ticer™ offered by Ticer Technologies, Chandler, Ariz. (USA). Note that the process employed to form the fine circuit lines or traces on the order described herein is dependent, in part, on the choice of material used for the circuit lines. For instance, if copper circuit lines are being fabricated, then additive processing, such as plating up copper traces, or subtractive processing, such as etching away unwanted copper between trace lines, can be employed.

Figure 3:
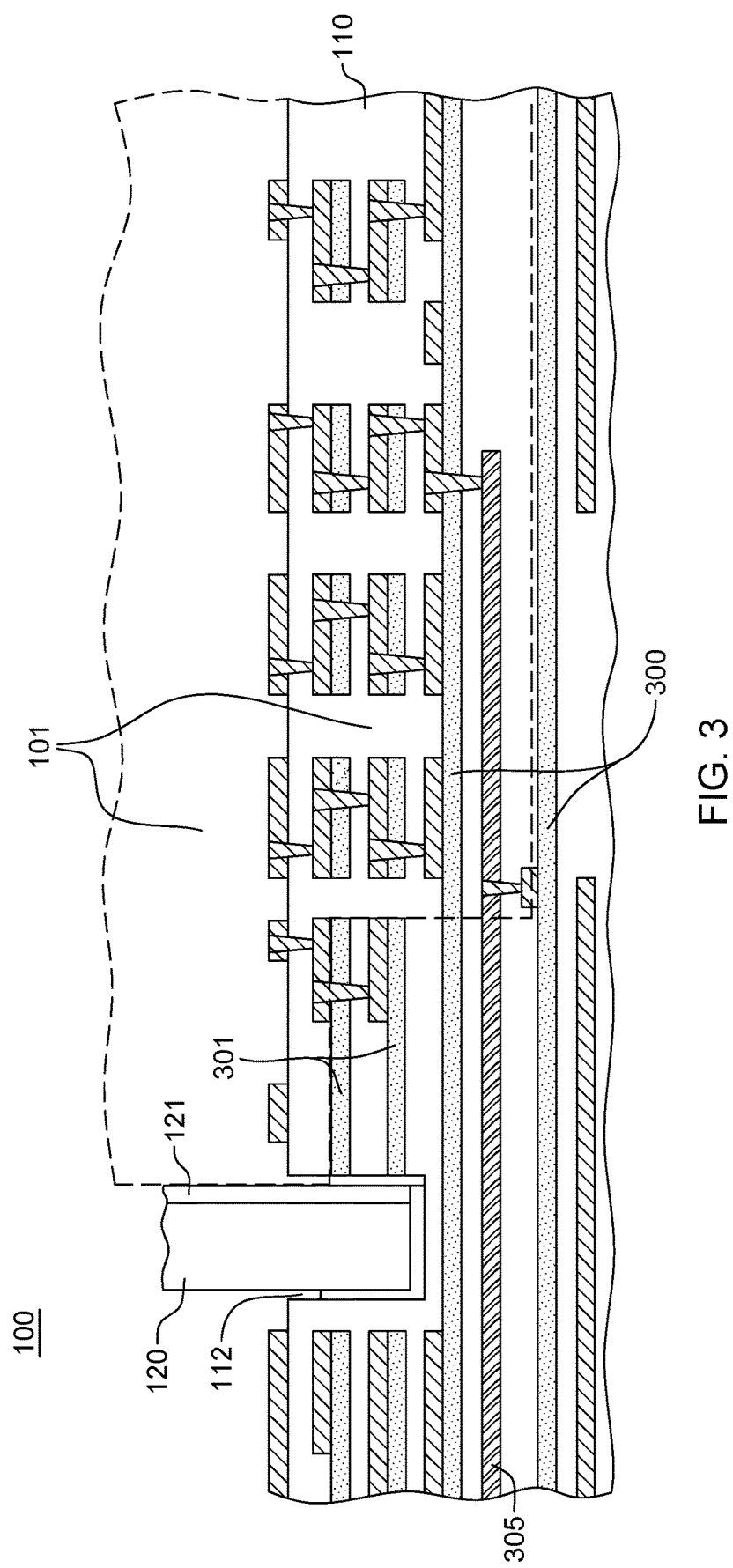
FIG. 3 is a partial cross-sectional elevational view of a more detailed embodiment of the tamper-respondent assembly of FIGS. 1A & 1B, including (in part), an enclosure and a multilayer circuit board with embedded tamper-detect circuits.

By way of further example, FIG. 3 depicts a partial cross-sectional elevational view of a more detailed embodiment of tamper-proof electronic package 100, and in particular, of multilayer circuit board 110, to which enclosure 120 is secured. In this configuration, the embedded tamper-respondent sensor includes multiple tamper-detection layers including, by way of example, at least one tamper-detection mat (or base) layer 300, and at least one tamper-detection frame 301. In the example depicted, two tamper-detection mat layers 300 and two tamper-detection frames 301 are illustrated, by way of example only. The lower-most tamper-detection mat layer 300 can be a continuous sense or detect layer extending completely below the secure volume being defined within and/or above multilayer circuit board 110. One or both tamper-detection mat layers 300 below secure volume 101 can be partitioned into multiple circuit zones, if desired. Within each tamper-detection mat layer, or more particularly, within each circuit zone of each tamper-detection mat layer, multiple circuits or conductive traces can be provided in any desired configuration. Further, the conductive traces within the tamper-detection layers can be implemented as, for instance, a resistive layer.

As illustrated, one or more external signal lines or planes 305 can enter secure volume 101 between, in one embodiment, two tamper-detection mat layers 300, and then electrically connect upwards into the secure volume 101 through one or more conductive vias, arranged in any desired location and pattern. In the configuration depicted, the one or more tamper-detection frames 301 are disposed at least inside of the area defined by continuous groove 112 accommodating the base of enclosure 120. Together with the tamper-respondent sensor(s) 121 associated with enclosure 120, tamper-detection frames 301, and tamper-detection mat layers 300, define secure volume 101, which can extend, in part, into multilayer circuit board 110. With secure volume 101 defined, in part, within multilayer circuit board 110, the external signal line(s) 305 can be securely electrically connected to, for instance, the one or more electronic components mounted to, or of, multilayer circuit board 110 within secure volume 101. In addition, secure volume 101 can accommodate electrical interconnection of the conductive traces of the multiple tamper-detection layers 300, 301, for instance, via appropriate monitor circuitry.

Added security can be provided by extending tamper-detection mat layers 300 (and if desired, tamper-detection frames 301) outward past the periphery of enclosure 120. In this manner, a line of attack can be made more difficult at the interface between enclosure 120 and multilayer circuit board 110 since the attack would need to clear, for instance, tamper-detection mat layers 300, the enclosure 120, as well as the tamper-detection frames 301 of the embedded tamper-detect circuit.

Numerous variations on multilayer circuit board 110 of FIGS. 1A-2 are possible. For instance, in one embodiment, the embedded tamper-detect circuit can include one or more tamper-detection mat layers 300 and one or more tamper-detection frames 301, such as described above, and a tri-plate structure comprising one or more external signal lines or layers sandwiched between an upper ground plane and a lower ground plane. In this configuration, high-speed transfer of signals to and from the secure volume, and in particular, to and from the one or more electronic components resident within the secure volume, can be facilitated.

Note also that, once the secure volume is defined, conductive vias within the secure volume between layers of multilayer circuit board 110 can be either aligned, or offset, as desired, dependent upon the implementation. Alignment of conductive vias can facilitate, for instance, providing a shortest connection path, while offsetting conductive vias between layers can further enhance security of the tamper-proof electronic package by making an attack into the secure volume through or around one or more tamper-detection layers of the multiple tamper-detection layers more difficult.

The tamper-detection layers of the embedded tamper-detect circuit formed within the multilayer circuit board of the electronic circuit or electronic package can include multiple conductive traces or lines formed between, for instance, respective sets of input and output contacts or vias at the trace termination points. Any pattern and any number of conductive traces or circuits can be employed in defining a tamper-detection layer or a tamper-detection circuit zone within a tamper-detection layer. For instance, 4, 6, 8, etc., conductive traces can be formed in parallel (or otherwise) within a given tamper-detection layer or circuit zone between the respective sets of input and output contacts to those conductive traces.

Figure 4:
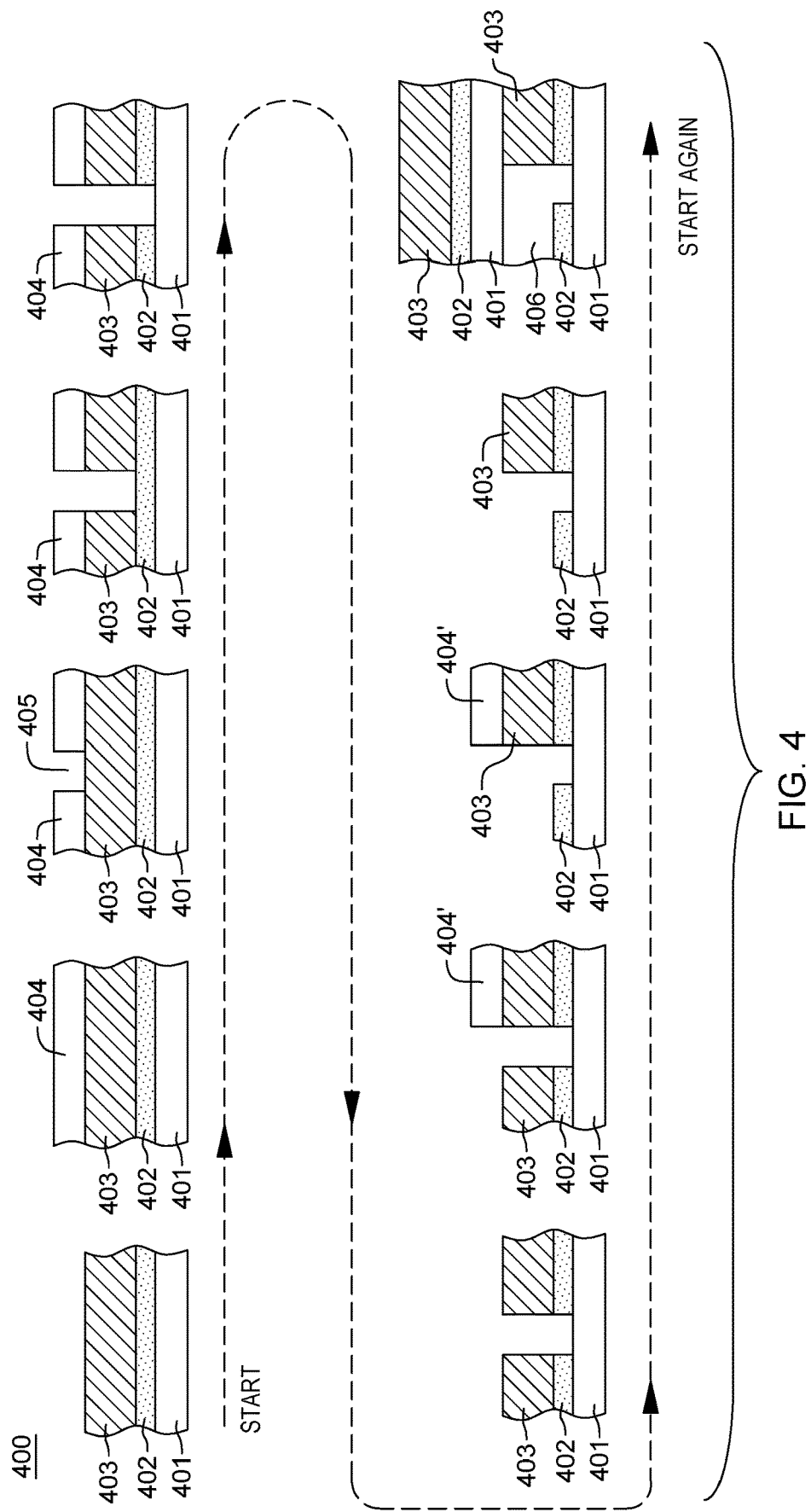
FIG. 4 depicts one embodiment of a process of fabricating a multilayer circuit board with an embedded tamper-detect circuit, in accordance with one or more aspects of the present invention.

In one or more implementations, the multilayer circuit board can be a multilayer wiring board or printed circuit board, or card, formed, for instance, by building up the multiple layers of the board. FIG. 4 illustrates one embodiment for forming and patterning a tamper-detection layer within such a multilayer circuit board.

As illustrated in FIG. 4, in one or more implementations, a tamper-detection layer, such as a tamper-detection mat layer or a tamper-detection frame disclosed herein, can be formed by providing a material stack comprising, at least in part, a structural layer 401, such as a pre-preg (or pre-impregnated) material layer, a trace material layer 402 for use in defining the desired trace patterns, and an overlying conductive material layer 403, to be patterned to define conductive contacts or vias electrically connecting to the pattern of traces being formed within the trace material layer 402, for instance, at trace terminal points. In one or more implementations, the trace material layer 402 can include nickel phosphorous (NiP), and the overlying conductive layer 403 can include copper. Note that these materials are identified by way of example only, and that other trace and/or conductive materials may be used within the build-up 400.

A first photoresist 404 is provided over build-up 400, and patterned with one or more openings 405, through which the overlying conductive layer 403 can be etched. Depending on the materials employed, and the etch processes used, a second etch process can be desired to remove portions of trace material layer 402 to define the conductive traces of the subject tamper-detection layer. First photoresist 404 can then be removed, and a second photoresist 404' is provided over the conductive layer 403 features to remain, such as the input and output contacts. Exposed portions of conductive layer 403 are then etched, and the second photoresist 404' can be removed, with any opening in the layer being filled, for instance, with an adhesive (or pre-preg) 406 and a next build-up layer is provided, as shown. Note that in this implementation, most of overlying conductive layer 403 is etched away, with only the conductive contacts or vias remaining where desired, for instance, at the terminal points of the traces formed within the layer by the patterning of the trace material layer 402. Note that any of a variety of materials can be employed to form the conductive lines or traces within a tamper-detection layer. Nickel-phosphorous (NiP) is particularly advantageous as a material since it is resistant to contact by solder, or use of a conductive adhesive to bond to it, making it harder to bridge from one circuit or trace to the next during an attempt to penetrate into the protected secure volume of the electronic circuit. Other materials which can be employed include OhmegaPly®, offered by Ohmega Technologies, Inc., of Culver City, Calif. (USA), or Ticer™, offered by Ticer Technologies of Chandler, Ariz. (USA).

The trace lines or circuits within the tamper-detection layers, and in particular, the tamper-detection circuit zones, of the embedded tamper-detect circuit, along with the tamper detector monitoring the enclosure, can be electrically connected to detect or compare circuitry provided, for instance, within secure volume 101 (FIG. 1A) of the tamper-proof electronic package. The detect or monitor circuitry can include various bridges or compare circuits, and conventional printed wiring board electrical interconnect inside secure volume 101 (FIG. 1A), for instance, located within the secure volume defined by the tamper-detection frames 301 (FIG. 3), and the tamper-detection mat layers 300 (FIG. 3).

Note that advantageously, different tamper-detection circuit zones on different tamper-detection layers can be electrically interconnected into, for instance, the same detect circuitry. Thus, any of a large number of interconnect configurations may be possible. For instance, if each of two tamper-detection mat layers contains 30 tamper-detection circuit zones, and each of two tamper-detection frames contains 4 tamper-detection circuit zones, then, for instance, the resultant 68 tamper-detection circuit zones can be connected in any configuration within the secure volume to create the desired arrangement of circuit networks within the secure volume being monitored for changes in resistance or tampering. Note in this regard, that the power supply or battery for the tamper-respondent sensor(s) can be located internal or external to the secure volume, with the sensor being configured to trip and destroy any protected or critical data if the power supply or battery is tampered with.

Figure 5:
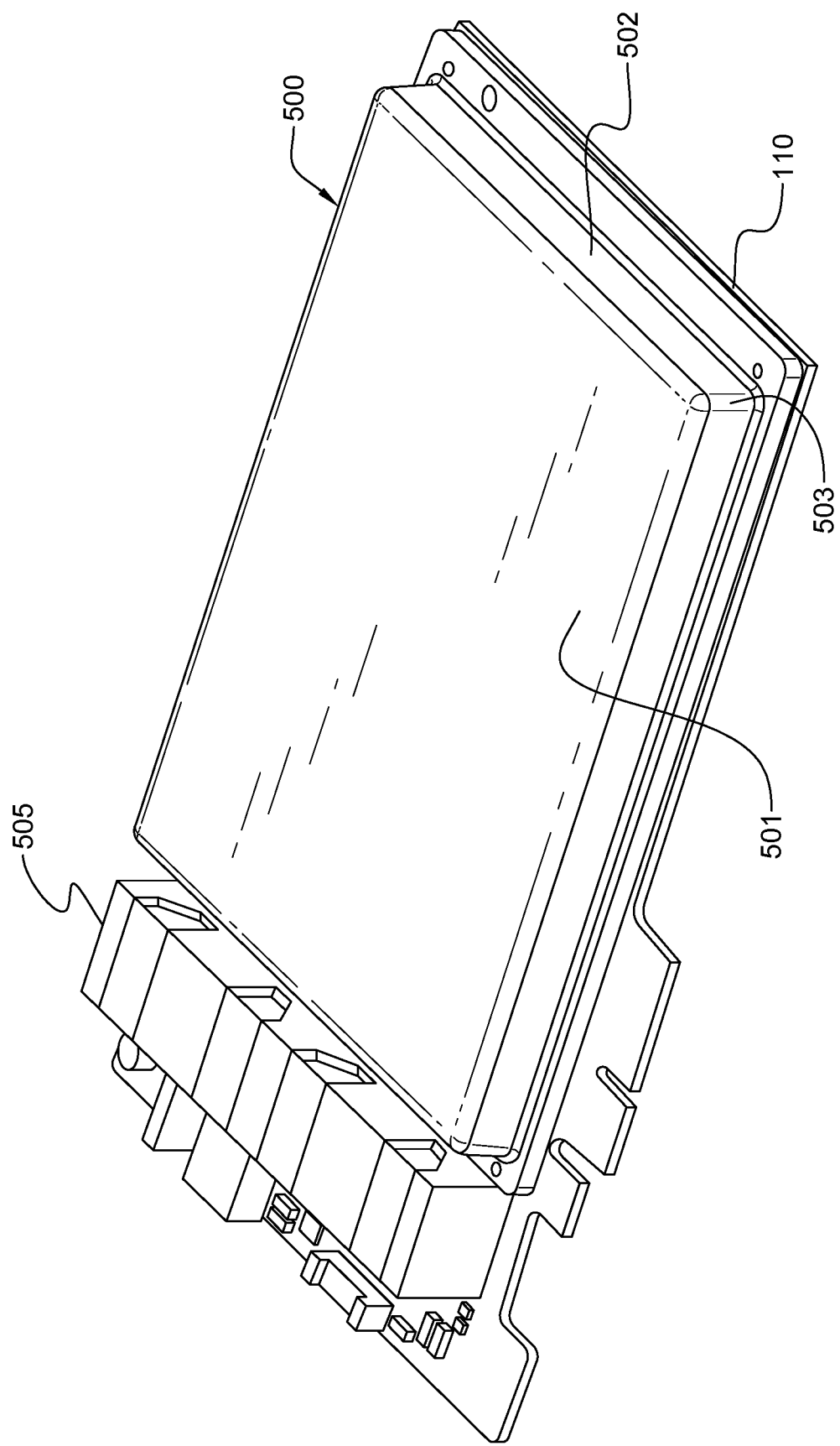
FIG. 5 is an isometric view of one embodiment of a tamper-respondent assembly, in accordance with one or more aspects of the present invention.

By way of further example, an isometric view of one embodiment of a tamper-proof electronic package, or tamper-respondent assembly, is depicted in FIG. 5, wherein an enclosure 500 (such as enclosure 120 of FIG. 1A, or the enclosures described below in connection with FIGS. 6A-11) is shown sealed to multilayer circuit board 110 to define a secure volume about one or more electronic components. In the embodiment depicted, enclosure 500 is formed of a thermally conductive material, and includes a main surface 501 and sidewall(s) 502 which include sidewall corners 503. An inner surface of enclosure 500 would include an inner main surface, and an inner sidewall surface corresponding to main surface 501 and sidewall(s) 502 respectively, with the inner main surface and inner sidewall surfaces being covered, in one embodiment, by one or more tamper-respondent sensors, that is, in an embodiment such as described above in connection with FIGS. 1A-2. A power supply 505 or battery for the tamper-respondent sensor can be located, as depicted in this embodiment, external to the secure volume, with the tamper detector being configured to trip and destroy any protected or critical data if the power supply or battery is tampered with. Enclosure 500 can be adhered to multilayer circuit board 110, which as noted herein, can include its own tamper protection.

With increased use of encryption and decryption in computing systems, novel tamper-respondent assemblies and methods of fabrication are desired, which provide enhanced tamper-proof protection for electronic components within the secure volume.

When considering tamper-proof packaging, the electronic package needs to achieve defined tamper-proof requirements, such as those set forth in the National Institutes of Standards and Technology (NIST) Publication FIPS 140-2, which is a U.S. Government Computer Security Standard, used to accredit cryptographic modules. The NIST FIPS 140-2 defines four levels of security, named Level 1 to Level 4, with Security Level 1 providing the lowest level of security, and Security Level 4 providing the highest level of security. At Security Level 4, physical security mechanisms are provided to establish a complete envelope of protection around the cryptographic module, with the intent of detecting and responding to any unauthorized attempt at physical access. Penetration of the cryptographic module enclosure from any direction has a very high probability of being detected, resulting in the immediate zeroization of all plain text critical security parameters (CSPs).

To address the demands for ever-improving anti-intrusion technology, and the higher-performance encryption/decryption functions being provided, enhancements to a Security Level 4 tamper-proof, tamper-evident packaging for one or more electronic components or assemblies are desired.

Disclosed hereinbelow with reference to FIGS. 6A-11 are various tamper-proof assemblies and methods of fabrication which provide, for instance, a Security Level 4 secure volume for accommodating one or more electronic components, such as one or more encryption and/or decryption modules and associated components of, for instance, a communications card or other electronic assembly to be protected, and which provide enhanced transfer of heat generated within the secure volume outward through the enclosure.

Figure 6A:
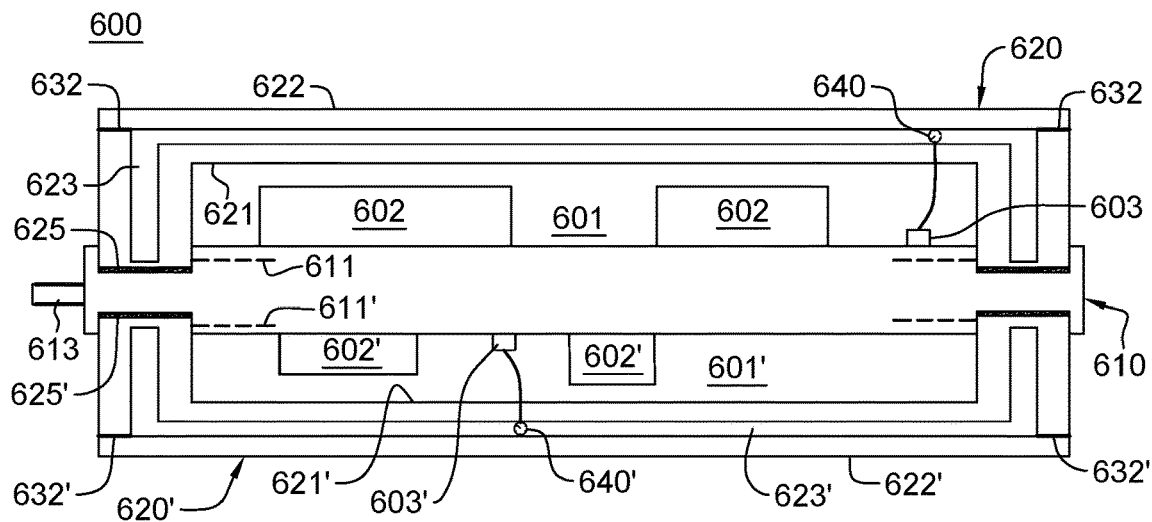
FIGS. 6A-6C depict one embodiment of a tamper-respondent assembly, which illustrate possible enclosure deflection with positive pressurization or negative pressurization of the sealed inner compartments of the enclosures.

By way of enhancement, FIG. 6A depicts one embodiment of a tamper-respondent assembly 600, which uses pressure-sensing or monitoring to detect a tamper event. In this embodiment, tamper-respondent assembly 600 includes a multilayer circuit board 610 with one or more electronic components 602, 602' coupled to a first side and a second side of the circuit board. In one or more implementations, multilayer circuit board 610 and one or more electronic components 602, 602' are similar to multilayer circuit board 110 and one or more electronic components 102, respectively, described above in connection with FIGS. 1A-5. For instance, multilayer circuit board 610 includes, in one or more embodiments, embedded tamper-respondent sensors 611, 611', similar to embedded tamper-respondent sensor 111 described above in connection with FIGS. 1A-4. In one or more implementations, electronic components 602, 602' include one or more application-specific integrated circuits to be protected. As illustrated, in one or more embodiments, a peripheral component interconnect (PCI) tab or bus 613 can be provided from multilayer circuit board 610 to connect to internal components and/or circuitry of the multilayer circuit board. Note that in this embodiment, embedded tamper-respondent sensors 611, 611' need only occupy a portion of the multilayer circuit board 610 in the vicinity of the trenches, such as shown. Together, first and second enclosures 620, 620' define the secure volume 601,601' on opposite sides of the circuit board, and the embedded tamper-respondent sensors protect against tampering along the enclosure-to-board interfaces.

As noted, tamper-respondent assembly 600 also includes first and second enclosures 620, 620' mounted to opposite sides of circuit board 610, such as within respective continuous grooves (or trenches) formed within the first and second sides of multilayer circuit board 610, and secured to multilayer circuit board 610 via, for instance, a structural adhesive 625, 625' disposed within the continuous grooves. In one or more embodiments, enclosures 620, 620' can be made of a thermally conductive material, such as a metal, and operate (in part) as heat sinks that facilitate cooling electronic components 602, 602' within respective first and second chambers of a defined secure volume 601, 601'. In one or more other embodiments, enclosures 620, 620' can be made of a plastic material, such as a polymer material, as described further below.

In the embodiment illustrated, tamper detection is implemented using pressure-sensing, and in particular, detection of a change in pressure, or change in a pressure differential. This pressure-sensing approach replaces a security mesh or tamper-respondent sensor associated with the inner surface of the enclosure of FIGS. 1A-2. For instance, in one or more embodiments, enclosures 620, 620' include respective sealed inner compartments 623, 623' between respective inner walls 621, 621' and outer walls 622, 622', with the sealed inner compartments being pressurized or depressurized at time of fabrication to facilitate monitoring for a change in pressure.

In one embodiment, sealed inner compartments 623, 623' can each be defined as a gap between the respective inner wall 621, 621' and outer wall 622, 622'. As explained below, in one embodiment, enclosure 620, 620' can be fabricated from a base metal element and an upper metal element, which are sealed together, such as by solder or braze 632, 632', resulting in inner walls 621, 621' and outer walls 622, 622', and the sealed inner compartments 623, 623'. Other enclosure implementations are also possible, such as described herein.

As illustrated in FIG. 6A, pressure sensors 640, 640' are provided, where pressure sensor 640 is located to monitor pressure within sealed inner compartment 623 of enclosure 620, and pressure sensor 640' is located to monitor pressure within sealed inner compartment 623' of enclosure 620'. In one or more other embodiments, pressure sensors (not shown) can be provided within the first and second chambers of the secure volume 601, 601', over the first side and second side of the multilayer circuit board, if desired. Further, one or more monitor circuits or modules 603, 603' are provided within, or on, multilayer circuit board 610. Pressure sensors 640, 640' provide sensed pressure data that is monitored by the monitor circuits 603, 603' to identify a change in pressure or a change in a pressure differential indicative of a tamper event. For instance, a change in pressure within the sealed inner compartment 623 occurs when there is an attempt to access the secure volume by drilling through enclosure 620. Those skilled in the art will understand that such a pressure change can be detected, or identified, in a variety of manners.

Figure 6B:
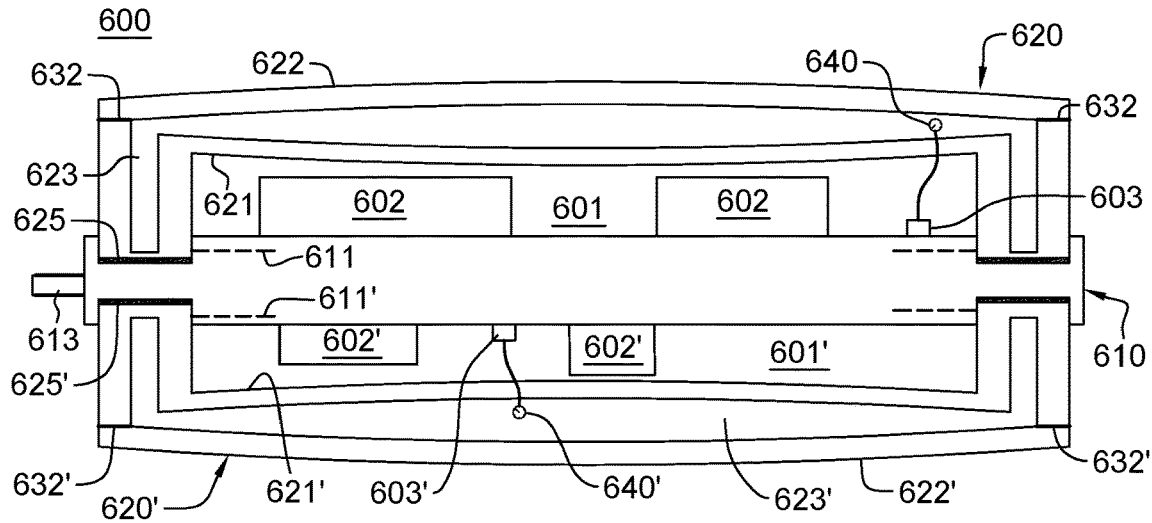
Figure 6C:
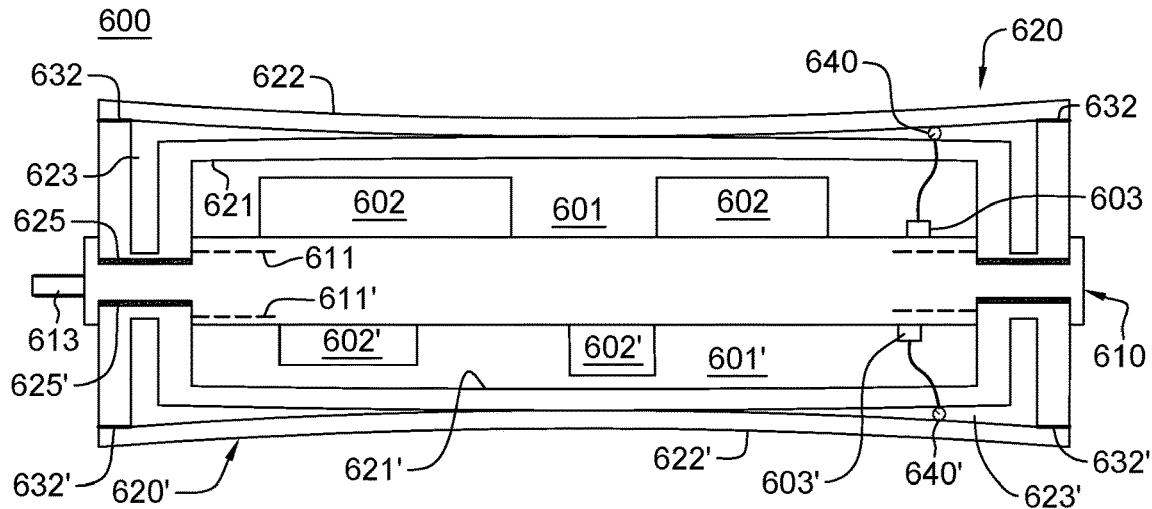

In one or more implementations, a positive pressure can be applied during fabrication to sealed inner compartment 623 and/or sealed inner compartment 623'. Depending on the positive pressure applied, and the pressure around the exterior of enclosure 620, 620', as well as within the secure volume, it is possible for inner walls 621, 621' and/or outer walls 622, 622' to bow out, as illustrated in FIG. 6B. FIG. 6C illustrates potential wall defection of the tamper-respondent assembly with negative pressurization during fabrication of sealed inner compartments 623, 623'.

The potential inner wall and outer wall deflections depicted in FIGS. 6B & 6C could negatively impact performance and/or life cycle of the tamper-respondent assembly. For instance, in one or more embodiments, a thermal interface material (not shown) can be provided to couple electronic components 602, 602' to respective inner walls 621, 621' of enclosures 620, 620' to facilitate heat transfer from the electronic components outward through the enclosures. Deflection of the enclosure walls, as illustrated in FIGS. 6B & 6C, could interfere with this heat transfer. Further, in the case of a positive pressurization, it is possible that the inward deflection of inner walls 621, 621' could apply sufficient force onto one or more electronic components within the secure volume to negatively affect operation of the components and/or the overall system.

Note further that, in one or more aspects, fabrication of the pressure-sensing, tamper-respondent assemblies disclosed herein can include providing a random pressurization or depressurization to the inner sealed compartments 623, 623' such that, for instance, the pressure within each sealed inner compartment is unknown and impossible to predict, with the inner pressure varying from tamper-respondent assembly to tamper-respondent assembly, as well as (if desired) between the enclosures of a particular tamper-respondent assembly. Deflection of the walls of the enclosures, as illustrated in FIG. 6B or 6C could disadvantageously signal that the inner sealed compartment(s) has been positive-pressurized or negative-pressurized, which is information desired to be maintained confidential.

FIGS. 7A-11 depict further embodiments of tamper-respondent assemblies, in accordance with one or more aspects of the present invention.

Figure 7A:
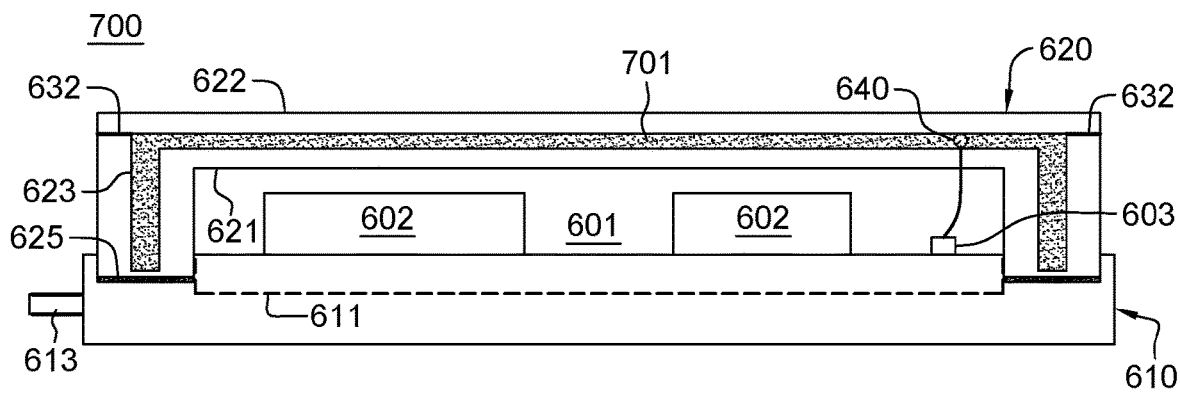
FIGS. 7A & 7B are cross-sectional elevational views of further embodiments of a tamper-respondent assembly (such as shown in FIG. 5) with a structural material within the sealed inner compartment(s), in accordance with one or more aspects of the present invention.
Figure 7B:
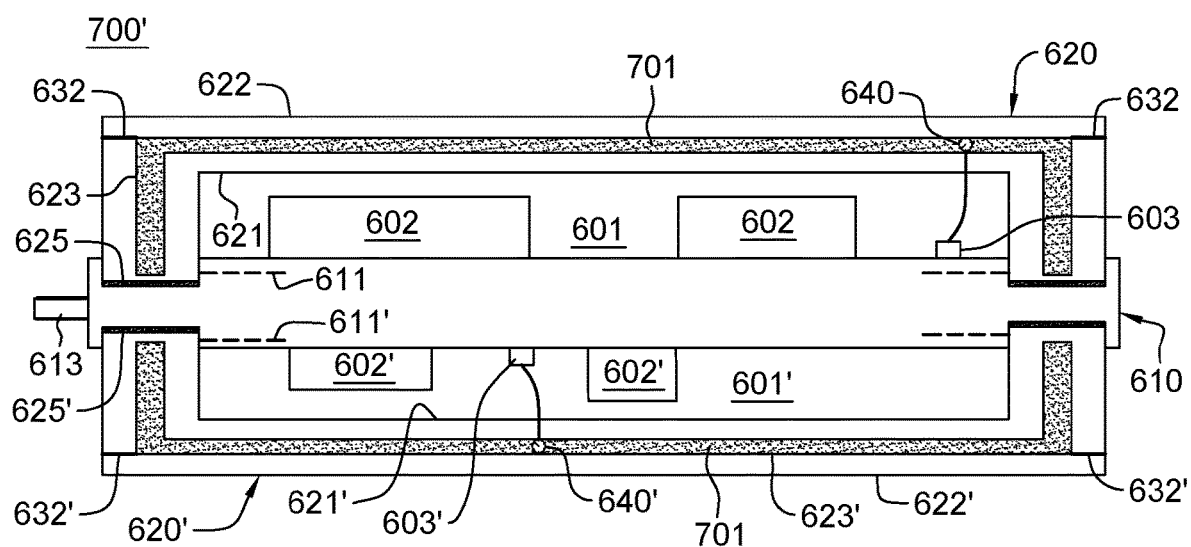

FIGS. 7A & 7B depict alternate embodiments of tamper-respondent assemblies 700, 700', in accordance with one or more aspects of the present invention. As illustrated in FIG. 7A, tamper-respondent assembly 700 is similar to tamper-respondent assembly 600 of FIG. 6A, with enclosure 620 being provided on one side of multilayer circuit board 610 to facilitate defining a secure volume 601 for one or more electronic components 602 mounted to, for instance, an upper surface of multilayer circuit board 610. As illustrated, multilayer circuit board 610 includes, in one or more embodiments, embedded tamper-respondent sensor 611, similar to embedded tamper-respondent sensor 111 described above in connection with FIGS. 1A-4.

In one or more implementations, enclosure 620 is the same or similar to enclosure 620 discussed above in connection with FIG. 6A, but with the addition of a structural material 701 provided within sealed inner compartment 623 of enclosure 620. This structural material 701 substantially fills the inner compartment (in one embodiment only) and is selected and configured to facilitate inhibiting deflection of the enclosure walls due to a pressure differential between pressure within the sealed inner compartment and pressure around the enclosure, as described herein.

FIG. 7B depicts another embodiment of a tamper-respondent assembly 700', which includes enclosure assemblies mounted to both the first and second sides of multilayer circuit board 610, similar to tamper-respondent assembly 600 of FIG. 6A. In this embodiment, structural material 701 is provided within both sealed inner compartments 623, 623' of enclosures 620, 620'. The structural material substantially fills the respective inner compartments (in one embodiment only), and is provided to inhibit deflection of the respective enclosure walls due to a pressure differential between pressure within the sealed inner compartment and pressure around, at least in part, the enclosure.

Note that in the embodiments of FIGS. 7A & 7B, the structural material 701 is configured to prevent the inner and/or outer walls of the respective enclosure from bowing-out with positive pressurization of the sealed inner compartment, and prevent bowing-in of the inner and/or outer walls of the enclosure with negative pressurization of the sealed compartment, while still allowing for pressure-sensing tamper detection.

As with tamper-respondent assembly 600 of FIG. 6A, tamper-respondent assemblies 700, 700' of FIGS. 7A & 7B implement tamper detection using pressure-sensing, and in particular, detection of a change in pressure or change in pressure differential. To facilitate this, pressure sensors 640, 640' are provided within the respective sealed inner compartments 623, 623' of the enclosures 620, 620'. As noted, structural material 701 substantially fills available space within the respective sealed inner compartment. In order to facilitate pressure-sensing, this structural material 701 is a porous material. For instance, the porous material can have a porosity of 80% or greater, such as greater than 90% porosity. In one or more implementations, the structural material is a foam metal with interconnected pores.

Figure 8B:
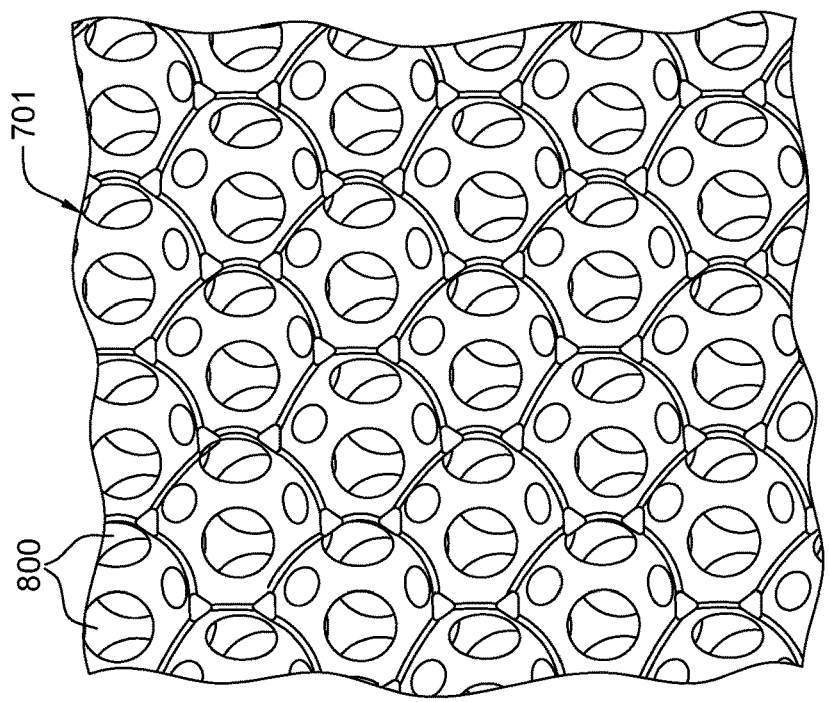
FIG. 8B is an enlarged depiction of one embodiment of the structural material of FIG. 8A, in accordance with one or more aspects of the present invention.
Figure 8A:
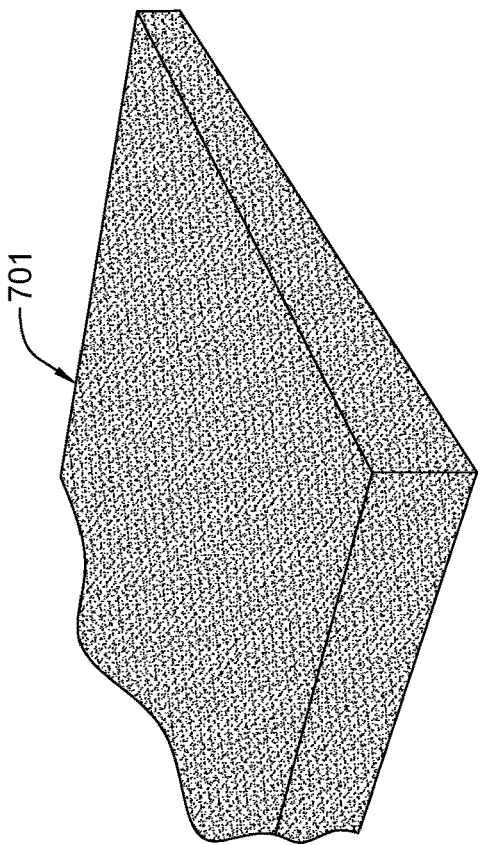
FIG. 8A is a partial depiction of a structural material for a tamper-respondent assembly, in accordance with one or more aspects of the present invention.

FIGS. 8A & 8B depict one embodiment of structural material 701 as a foam metal with interconnected pores 800. The foam metal advantageously provides structural rigidity to the enclosure assembly when secured within the enclosure between the inner and outer walls, while also allowing for rapid change in pressure due to, for instance, an attempted tamper event by drilling through the enclosure into the foam metal. As noted, during fabrication, the sealed inner compartments can be pressurized or depressurized. This pressurization or depressurization provides a pressure differential between pressure within the sealed inner compartment and pressure around the exterior of the enclosure, or even within the secure volume of the tamper-respondent assembly. In one embodiment, all pores of the foam metal are interconnected, with pore size being controllable for a desired application. In one or more embodiments, the pores are of micron size. Further, in one or more embodiments, the physical strength of the foam metal can be controlled by adjusting, for instance, porosity of the foam metal. As one embodiment only, the foam metal could be a Duocel®

Aluminum Foam (with 8% nominal density 6101-T6), offered by ERG Aerospace Corporation, of Oakland, Calif. (USA).

As noted, during fabrication, the sealed inner compartments can be pressurized or depressurized in a pressure-sensing implementation such as disclosed herein. This pressurization or depressurization provides a pressure differential between pressure within the sealed inner compartment and the pressure around the exterior of the enclosure, or even within the secure volume of the tamper-respondent assembly. Further, as noted, in one or more implementations, the pressurization or depressurization of the sealed inner compartment is random, and can vary between compartments of a particular tamper-respondent assembly, or even between chambers of a particular enclosure of a tamper-respondent assembly, as described further below. Advantageously, providing structural material 701 within the enclosure, with the structural material secured to the walls of the enclosure, inhibits any deflection of the walls of the enclosure due to the difference in pressure between pressure within the sealed inner compartment and pressure around, at least in part, the enclosure.

Figure 9A:
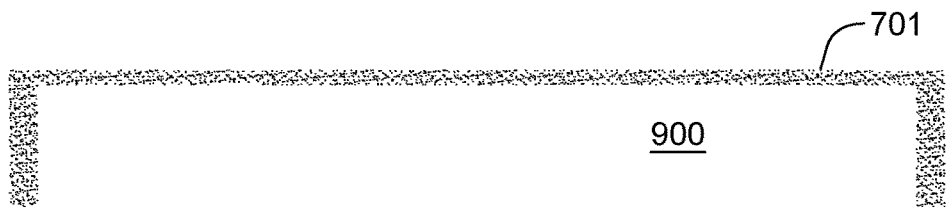
FIGS. 9A-9D depict one embodiment of a process of fabricating an enclosure for a tamper-respondent assembly with structural material, such as depicted in FIG. 7B, in accordance with one or more aspects of the present invention.

FIGS. 9A-9D depict one embodiment of a process of fabricating a tamper-respondent assembly with a structural material, such as depicted in FIGS. 7A & 7B. As illustrated in FIG. 9A, the structural material 701, such as a foam metal, can be pre-formed to the desired size and shape, such as a machining, trenching, or other forming operation. In the embodiment illustrated, the structural material is formed with an inner space 900 that is to facilitate defining a portion of the secure volume. In one specific embodiment, the inner space (or depth) of the channel can be, for instance, in the range of 4-5 mm.

Figure 9B:
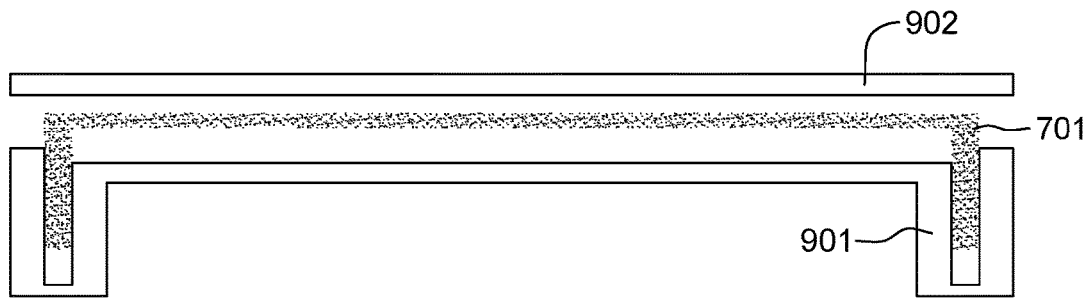

As illustrated in FIG. 9B, a base element 901, such as a base metal element, can be pre-formed by extrusion to accommodate structural material 701 within a channel or gap, which will form a portion of the sealed inner compartment of the enclosure once assembled. Further, an upper element 902, such as an upper metal element, is sized and configured to mount to base element 901 and be secured in place via a solder and/or braze 632, with the resultant enclosure assembly depicted in FIG. 9C. As illustrated, the enclosure assembly includes an enclosure 620 with inner wall 621 and outer wall 622, between which the inner sealed compartment is defined, and in the depicted embodiment, filled with structural material 701. In one embodiment only, the upper plate-foam metal-base plate thicknesses can be 1 mm-1 mm-1 mm. Also, in one or more embodiments, structural material 701 is diffusion-bonded to the base element and to the upper element, forming the inner and outer walls to securely bond the structural material to the enclosure walls.

The pressure sensor 640 is implanted inside the structural material (in one embodiment), and the inner wall is sealed around the sensor wire using a fastener and/or adhesive. The sealed inner compartment is then pressurized (e.g., to 1.5-2 atmospheric pressure) or depressurized (e.g., 0-0.5 atmospheric pressure), randomly if desired via a fill port (not shown). Once pressurized or depressurized, the fill port can be plugged or sealed using, for instance, solder or braze material.

Once fabricated, any attempt at drilling through the enclosure assembly will cause a pressure change within the sealed inner compartment of the enclosure that is detected via the pressure sensor, which facilitates identifying the tamper event. Based on identifying the tamper event, a trigger signal or alarm can be issued by the monitor circuit to protect any confidential data within the secure volume of the tamper-respondent assembly.

Figure 9C:
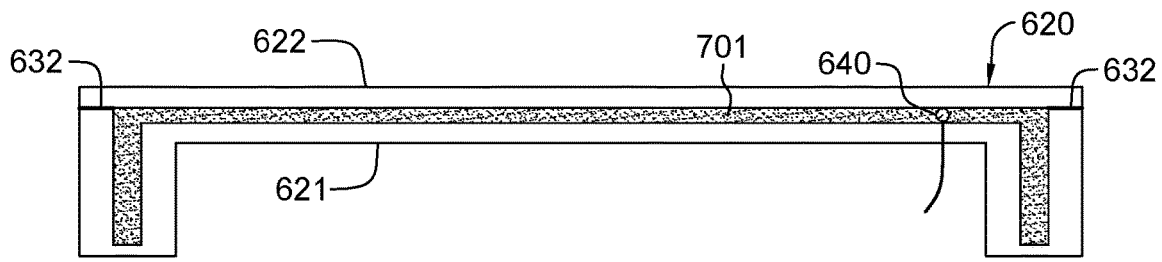
Figure 9D:
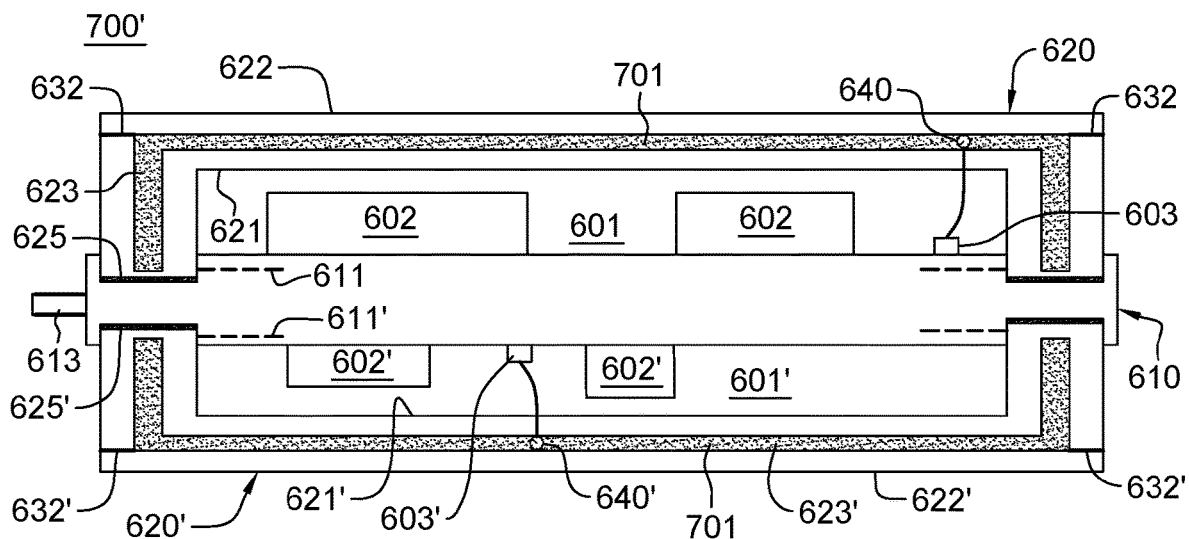

As illustrated in FIG. 9D, the enclosure assembly of FIG. 9C is mounted to a surface of a circuit board, such as the above-described multilayer circuit board 610, to enclose one or more electronic components within a secure volume, as described above. In FIG. 9D, two enclosure assemblies, fabricated such as described above in connection with FIGS. 9A-9C, are mounted to opposite sides of the multilayer circuit board 610, resulting in the two-sided tamper-respondent assembly embodiment described above in connection with FIG. 7B.

Figure 10A:
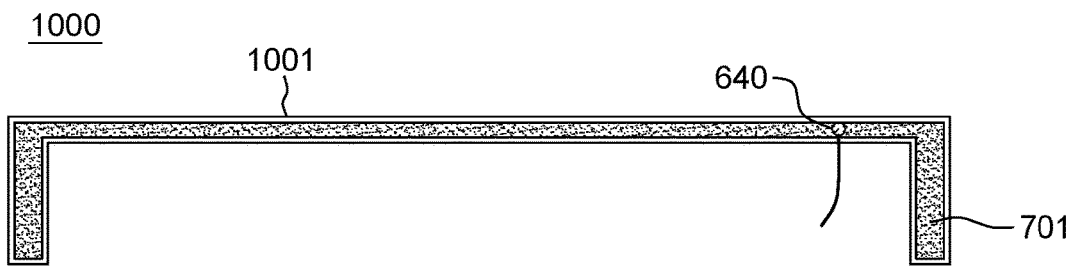
FIG. 10A illustrates another embodiment of a structural material with an epoxy coating defining an enclosure of a tamper-respondent assembly, in accordance with one or more aspects of the present invention.
Figure 10B:
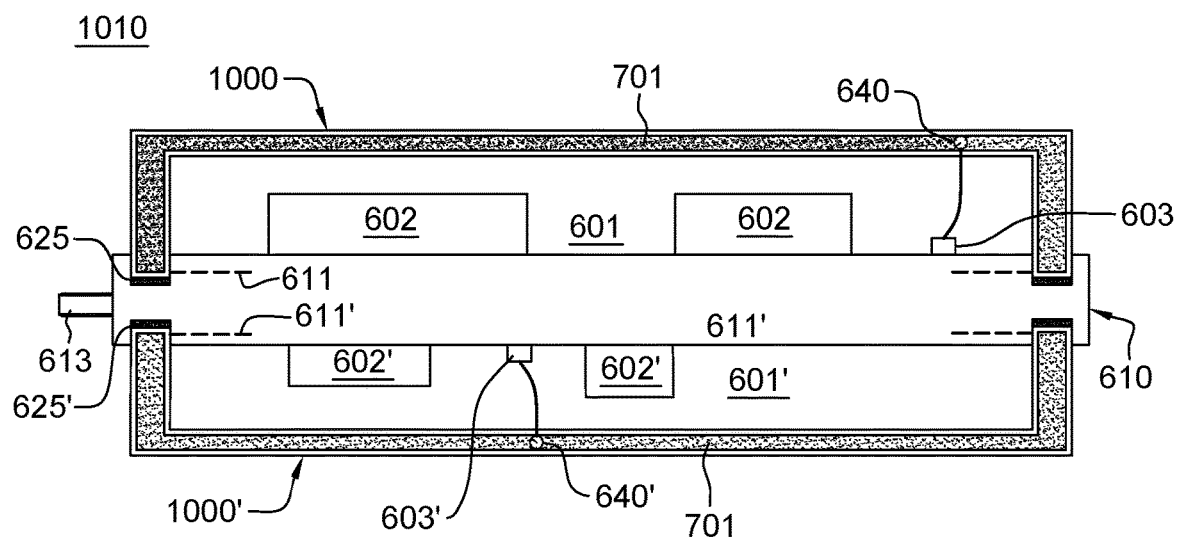
FIG. 10B is a cross-sectional elevational view of another embodiment of a tamper-respondent assembly, with enclosures such as depicted in FIG. 10A, in accordance with one or more aspects of the present invention.

FIGS. 10A-10B depict an alternate tamper-respondent assembly approach. In FIG. 10A, an enclosure 1000 is fabricated by starting with structural material 701, such as a foam metal, and applying a polymer coating 1001, such as an epoxy coating, fully around the structural material. For instance, the polymer coating 1001 can be a polyimide film that is heated and physically wrapped around the structural material, and then cured. If desired, an appropriate force can be applied during curing to facilitate securing the coating to the structural material. In one implementation, the polymer material is wrapped around the structural material, heated, and a force is applied to compress the coating into the structural material, adhering the layers together. By wrapping the coating fully around the structural material and sealing the coating to the structural material, the polymer coating itself becomes the enclosure, which defines a sealed inner compartment that is filled or substantially filled with the structural material 701. One or more pressure sensors 640 can be provided within the structural material, either before or after the sealing of the structural material with the polymer coating to define the sealed inner compartment.

FIG. 10B depicts one embodiment of a tamper-respondent assembly 1010 with enclosure assemblies that use enclosures 1000, 1000', such as described above in connection with FIG. 10A. As illustrated, enclosure 1000 replaces the above-described enclosures 620, 620' of the two-sided pressure-sensing tamper-respondent assembly of FIG. 7B, with tamper-respondent assembly 1010 otherwise being similar or identical to tamper-respondent assembly 700' described above in connection with FIG. 7B.

Figure 11:
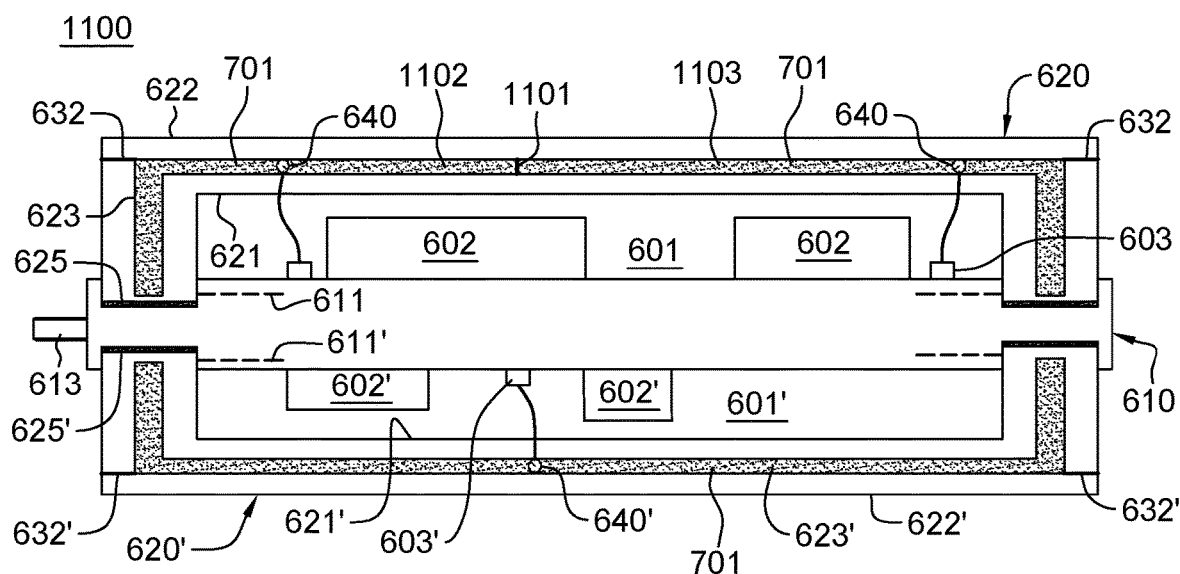
FIG. 11 is a cross-sectional elevational view of a further embodiment of a tamper-respondent assembly, with an enclosure having multiple sealed inner compartments with structural material, in accordance with one or more aspects of the present invention.

FIG. 11 depicts another embodiment of a tamper-respondent assembly 1100, similar to tamper-respondent assembly 700' described above in connection with FIG. 7B. In this embodiment, tamper-respondent assembly 1100 is substantially identical to tamper-respondent assembly 700' described above, but with the addition of at least one dividing wall 1101 which separates sealed inner compartment 623 into two or more separate sealed inner chambers 1102, 1103, each of which contains structural material 701, as described herein. In one embodiment, this allows different portions of enclosure 620 to be pressurized differently, thereby further inhibiting an ability to tamper with the enclosure. For instance, first sealed inner chamber 1102 can be at a first pressure, and second sealed inner chamber 1103 can be at a second pressure, where the first and second pressures are different pressures. Further, in one embodiment, the first pressure and the second pressure are each randomly-selected pressures. Note also that one or more dividers 1101 can be provided in both enclosures 620, 620', if desired. In this manner, many different positive and/or negative pressures can be used in different versions of the tamper-respondent assembly, which can advantageously inhibit any attempt to open or drill through the enclosure. In one embodiment, each sealed inner chamber of a sealed inner compartment of an enclosure has an associated pressure sensor 640, which is operatively coupled to one or more monitor circuits 603, 603' within the secure volume of the tamper-respondent assembly. Any attempt at drilling through a respective sealed inner chamber will cause a pressure change, which will trigger a response within the secure volume to maintain security of the confidential information by, for instance, erasing the secure information.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A tamper-respondent assembly comprising:
   a circuit board, the circuit board including an electronic component;
   an enclosure assembly mounted to the circuit board to enclose the electronic component within a secure volume, the enclosure assembly comprising:
      an enclosure with an outer wall and an inner wall, the inner wall and the outer wall having a gap therebetween defining a sealed inner compartment of the enclosure, and the enclosure being mounted to the circuit board to facilitate defining the secure volume between the enclosure and the circuit board;
      the sealed inner compartment of the enclosure being pressurized or depressurized; and
      a structural material within the sealed inner compartment of the enclosure, the structure material within the enclosure inhibiting deflection of the enclosure due to a pressure differential between pressure of the sealed inner compartment and pressure around, at least in part, the enclosure due to the sealed inner compartment of the enclosure being pressurized or depressurized; and
   a pressure sensor to sense pressure within the sealed inner compartment of the enclosure to facilitate identifying a pressure change indicative of a tamper event.

2. The tamper-respondent assembly of claim 1, wherein the structural material substantially fills the sealed inner compartment of the enclosure.

3. The tamper-respondent assembly of claim 1, wherein the structural material comprises a porous structure.

4. The tamper-respondent assembly of claim 3, wherein the porous structure has a porosity of 80% or greater.

5. The tamper-respondent assembly of claim 1, wherein the structural material comprises a foam metal with interconnected pores.

6. The tamper-respondent assembly of claim 5, wherein the enclosure comprises a metal enclosure with the inner wall and the outer wall, and the foam metal within the sealed inner compartment is diffusion-bonded to the inner wall and to the outer wall.

7. The tamper-respondent assembly of claim 5, wherein the enclosure comprises a polymer coating surrounding the foam metal.

8. The tamper-respondent assembly of claim 1, wherein the sealed inner compartment comprises a first sealed inner chamber and a second sealed inner chamber, the first and second sealed inner chambers being separate sealed inner chambers, and the structural material being within the first sealed inner chamber and within the second sealed inner chamber.

9. The tamper-respondent assembly of claim 8, wherein the first sealed inner chamber is at a first pressure and the second sealed inner chamber is at a second pressure, wherein the first pressure and the second pressure are different pressures.

10. The tamer-respondent assembly of claim 9, wherein the first pressure and the second pressure are each a random pressure.

11. The tamper-respondent assembly of claim 1, further comprising a monitor circuit positioned within the secure volume to monitor, via the pressure sensor, pressure within the sealed inner compartment to identify the pressure change indicative of the tamper event.

12. A tamper-respondent assembly comprising:
   a circuit board comprising a first side and a second side, the first side and the second side being opposite sides of the circuit board;
   multiple electronic components, including at least one first electronic component coupled to the first side of the circuit board, and at least one second electronic component coupled to the second side of the circuit board;
   a first enclosure assembly mounted to the first side of the circuit board to enclose the at least one first electronic component coupled to the first side of the circuit board within a first chamber of a secure volume, the first enclosure assembly comprising:
      an enclosure with an outer wall and an inner wall, the inner wall and the outer wall having a gap therebetween defining a sealed inner compartment of the enclosure, and the enclosure being mounted to the circuit board to facilitate defining the secure volume between the enclosure and the circuit board;
      the sealed inner compartment of the enclosure being pressurized or depressurized; and a structural material within the sealed inner compartment of the enclosure, the structure material within the enclosure inhibiting deflection of the enclosure due to a pressure differential between pressure of the sealed inner compartment and pressure around, at least in part, the enclosure due to the sealed inner compartment of the enclosure being pressurized or depressurized;

a second enclosure assembly mounted to the second side of the circuit board to enclose the at least one second electronic component coupled to the second side of the circuit board within a second chamber of the secure volume; and a pressure sensor to sense pressure within the sealed inner compartment of the enclosure to facilitate identifying a pressure change indicative of a tamper event.

13. The tamper-respondent assembly of claim 12, wherein the structural material comprises a foam metal with interconnected pores.

14. The tamper-respondent assembly of claim 13, wherein the foam metal substantially fills the sealed inner compartment of the enclosure.

15. The tamper-respondent assembly of claim 14, wherein the enclosure comprises a metal enclosure with an inner wall and an outer wall, and the foam metal within the sealed inner compartment is diffusion-bonded to the inner wall and to the outer wall.

16. The tamper-respondent assembly of claim 13, wherein the enclosure comprises a polymer coating surrounding the foam metal.

17. The tamper-respondent assembly of claim 12, wherein the structural material comprises a porous structure, the porous structure having a porosity of 80% or greater.

18. A method of fabricating a tamper-respondent assembly, the method comprising:

providing a circuit board, the circuit board including an electronic component;

mounting an enclosure assembly to the circuit board to enclose the electronic component within a secure volume, the enclosure assembly comprising:

an enclosure with an outer wall and an inner wall, the inner wall and the outer wall having a gap therebetween defining a sealed inner compartment of the enclosure, and the enclosure being mounted to the circuit board to facilitate defining the secure volume between the enclosure and the circuit board;

the sealed inner compartment of the enclosure being pressurized or depressurized; and a structural material within the sealed inner compartment of the enclosure, the structure material within the enclosure inhibiting deflection of the enclosure due to a pressure differential between pressure of the sealed inner compartment and pressure around, at least in part, the enclosure due to the sealed inner compartment of the enclosure being pressurized or depressurized; and providing a pressure sensor to sense pressure within the sealed inner compartment of the enclosure to facilitate identifying a pressure change indicative of a tamper event.

19. The method of claim 18, wherein the structural material comprises a foam metal with interconnected pores.

20. The method of claim 19, wherein the foam metal substantially fills the sealed inner compartment of the enclosure.

* * * * *